(12) United States Patent
Chen et al.

(10) Patent No.: US 12,132,067 B2
(45) Date of Patent: Oct. 29, 2024

(54) IMAGE SENSOR

(71) Applicant: ENKRIS SEMICONDUCTOR, INC., Suzhou (CN)

(72) Inventors: Yuchao Chen, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 183 days.

(21) Appl. No.: 18/157,009

(22) Filed: Jan. 19, 2023

(65) Prior Publication Data

US 2024/0096916 A1   Mar. 21, 2024

(30) Foreign Application Priority Data

Sep. 20, 2022 (CN) .......................... 202211144860.3

(51) Int. Cl.
*H01L 27/146* (2006.01)
*H04N 23/741* (2023.01)
*H04N 25/57* (2023.01)

(52) U.S. Cl.
CPC .. *H01L 27/14647* (2013.01); *H01L 27/14607* (2013.01); *H01L 27/14609* (2013.01); *H01L 27/1461* (2013.01); *H01L 27/14621* (2013.01); *H01L 27/14638* (2013.01); *H04N 23/741* (2023.01); *H04N 25/57* (2023.01)

(58) Field of Classification Search
CPC .................. H04N 23/741; H04N 25/57; H01L 27/14607; H01L 27/14609; H01L 27/14621; H01L 27/14638; H01L 27/14647
See application file for complete search history.

(56) References Cited

U.S. PATENT DOCUMENTS

| 6,930,336 B1 * | 8/2005 | Merrill | H01L 27/14647 257/292 |
| 2007/0131987 A1 * | 6/2007 | Kim | H01L 27/14647 257/E27.131 |
| 2018/0081099 A1 * | 3/2018 | Toda | H01L 27/14621 |
| 2021/0066384 A1 * | 3/2021 | Greco | H10K 85/50 |

* cited by examiner

*Primary Examiner* — Lin Ye
*Assistant Examiner* — Chriss S Yoder, III
(74) *Attorney, Agent, or Firm* — Westbridge IP LLC

(57) ABSTRACT

Disclosed is an image sensor. The image sensor includes at least one photosensitive unit including at least two photosensitive layers stacked and not completely overlapped, a region where each photosensitive layer is not overlapped with other photosensitive layers being configured to arrange an electrode wire, and photosensitive component contents of the at least two photosensitive layers being different. According to the present disclosure, a wavelength range of sensible light of each photosensitive unit may be enlarged, so that more image details may be recorded, images with a high dynamic range may be generated, and people may experience a visual effect close to a real environment. In addition, as there is no need to reduce a photosensitive area of the photosensitive layer for arranging the electrode wires, the photosensitive area of the photosensitive layer is increased and thereby a dynamic range of the image sensor is improved.

13 Claims, 5 Drawing Sheets

IMAGE SENSOR

CROSS-REFERENCE TO RELATED APPLICATIONS

The application claims priority to Chinese Patent Application No. 202211144860.3, filed on Sep. 20, 2022, the entire contents of which are incorporated herein by reference.

TECHNICAL FIELD

The present disclosure relates to the technical field of image processing, and in particular, to an image sensor.

BACKGROUND

An image sensor is an important part of a camera device. In the prior art, an image sensing function is realized by a single photosensitive layer with a plurality of color filters, and superimposing photosensitive layers of different colors may be found in few image sensors. In a shooting environment with a wide range of brightness, existing image sensors cannot generate an image with a high dynamic range and accordingly cannot provide more image details. As a result, a visual effect of a real environment cannot be restored.

SUMMARY

In order to solve the above technical problems, the present disclosure is presented. Embodiments of the present disclosure provide an image sensor.

An embodiment of the present disclosure provides an image sensor, including: at least one photosensitive unit, the photosensitive unit including at least two photosensitive layers stacked and not completely overlapped, a region where each of the at least two photosensitive layers is not overlapped with other photosensitive layers being configured to arrange an electrode wire, and photosensitive component contents of the at least two photosensitive layers being different.

In some embodiments of the present disclosure, areas of the at least two photosensitive layers are equal.

In some embodiments of the present disclosure, a photosensitive component includes an indium-containing GaN-based compound, and indium component contents of the at least two photosensitive layers are different.

In some embodiments of the present disclosure, the at least two photosensitive layers sense light of the same color, and a difference between the indium component contents of the at least two photosensitive layers is less than or equal to 4%.

In some embodiments of the present disclosure, the at least two photosensitive layers include an outer photosensitive layer closest to an external light source; and if the at least two photosensitive layers include three or more than three photosensitive layers, an indium component content of the outer photosensitive layer is higher than a minimum value of indium component contents of photosensitive layers other than the outer photosensitive layer in the at least two photosensitive layers, and the indium component content of the outer photosensitive layer is lower than a maximum value of the indium component contents of the photosensitive layers other than the outer photosensitive layer in the at least two photosensitive layers.

In some embodiments of the present disclosure, the at least two photosensitive layers sense light of different colors, the photosensitive unit includes three photosensitive layers stacked and not completely overlapped, the three photosensitive layers include a red photosensitive layer for sensing red light, a green photosensitive layer for sensing green light and a blue photosensitive layer for sensing blue light, and an indium component content of the red photosensitive layer, an indium component content of the green photosensitive layer and an indium component content of the blue photosensitive layer are in a descending order.

In some embodiments of the present disclosure, the green photosensitive layer is stacked on a side of the red photosensitive layer away from an external light source, and/or the blue photosensitive layer is stacked on the side of the red photosensitive layer away from the external light source.

In some embodiments of the present disclosure, the at least two photosensitive layers are rotationally staggered with each other with a center of the photosensitive unit as a rotation center to form the at least two photosensitive layers stacked and not completely overlapped.

In some embodiments of the present disclosure, the image sensor further includes: charge storage parts electrically connected to the at least two photosensitive layer respectively, where the charge storage part is electrically connected to the electrode wires, and charge storage parts are electrically connected to the at least two photosensitive layer respectively.

In some embodiments of the present disclosure, the image sensor further includes: a plurality of the photosensitive units, and an isolation part provided between two adjacent photosensitive units, where the isolation part is configured to electrically insulate the adjacent photosensitive units from each other.

In some embodiments of the present disclosure, the isolation part includes a metal member and a transparent insulation layer arranged on an outer surface of the metal member; and the metal member includes a metal grid used for reflecting light obliquely projecting to the photosensitive unit.

In some embodiments of the present disclosure, a shape of the at least two photosensitive layer includes one or more of a polygon, an ellipse and a circle.

In some embodiments of the present disclosure, the image sensor further includes a first semiconductor layer and a second semiconductor layer, the first semiconductor layer, the photosensitive layer and the second semiconductor being stacked in sequence.

The present disclosure provides an image sensor, including: at least one photosensitive unit, the photosensitive unit including at least two photosensitive layers stacked and not completely overlapped, a region where each of the at least two photosensitive layers is not overlapped with other photosensitive layers being configured to arrange an electrode wire, and photosensitive component contents of the at least two photosensitive layers being different. According to the present disclosure, at least two photosensitive layers which are not completely overlapped are arranged for each photosensitive unit, and the photosensitive component contents of the at least two photosensitive layers are different, which enlarges a wavelength range of sensible light of each photosensitive unit, so that more image details may be recorded to generate an image with a high dynamic range, which enables people to experience a visual effect close to a real environment. In addition, in each photosensitive unit, an electrode wire is provided in a region of each photosensitive layer where the photosensitive layer does not overlap with other photosensitive layers, so that there is no need to reduce a photosensitive area of the photosensitive layer for arranging the electrode wires. Therefore, the photosensitive area of the photosensitive layer is increased and thereby a dynamic range of the image sensor is improved.

BRIEF DESCRIPTION OF THE DRAWINGS

Through a more detailed description of the embodiments of the present disclosure with reference to the accompanying drawings, the above and other purposes, features and advantages of the present disclosure will become more obvious. The accompanying drawings are provided for further understanding of the present disclosure, and constitute a part of the specification. The accompanying drawings and the embodiments of the present disclosure are used to explain the present disclosure and do not constitute a limitation to the present disclosure. In the accompanying drawings, a same reference label is used for representing the same component or step.

DETAILED DESCRIPTION OF THE EMBODIMENTS

The technical solutions in the embodiments of the present disclosure will be clearly and completely described below with reference to the accompanying drawings in the embodiments of the present disclosure. Apparently, the described embodiments are only a part of the embodiments of the present disclosure, but not all of the embodiments. Based on the embodiments in the present disclosure, all other embodiments obtained by those skilled in the art without creative efforts shall fall within the protection scope of the present disclosure.

In addition, in order to better illustrate the present disclosure, numerous specific details are given in the following detailed description. It should be understood by those skilled in the art that the present disclosure may be practiced without certain specific details. In some instances, methods, means, components and circuits well known to those skilled in the art have not been described in detail so as not to obscure the subject matter of the present disclosure.

In an existing manner of superimposing, an utilization rate of photosensitive area of the photosensitive layer is low. Therefore, how to keep a balance between enlarging the photosensitive area of the photosensitive layer and improving a dynamic range of the image sensor is an urgent problem to be solved.

Figure 1:
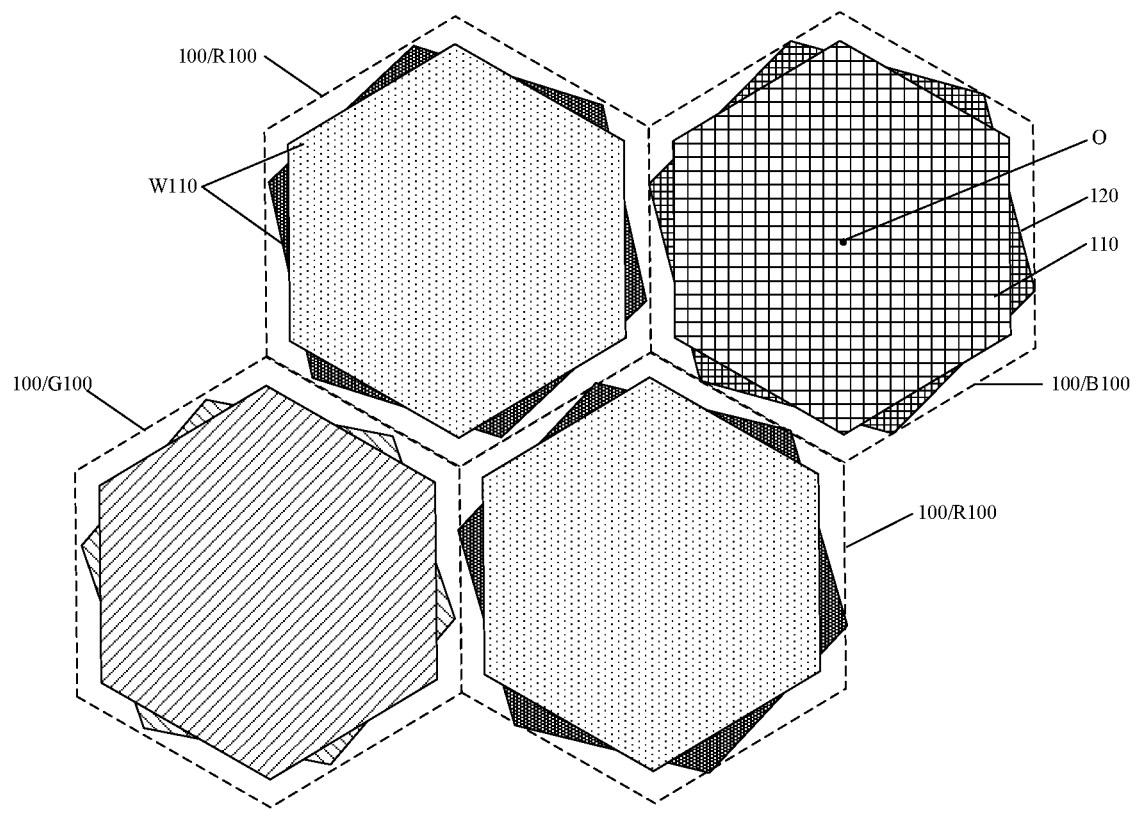
FIG. 1 is a structural schematic diagram of a photosensitive unit provided by an exemplary embodiment of the present disclosure.

FIG. 1 is a schematic structural diagram of a photosensitive unit provided by an exemplary embodiment of the present disclosure. As shown in FIG. 1, an image sensor provided by the embodiment of the present disclosure includes at least one photosensitive unit 100, where the photosensitive unit 100 includes at least two photosensitive layers stacked and not completely overlapped, a region where each photosensitive layer is not overlapped with other photosensitive layers is configured to arrange an electrode wire, and photosensitive component contents of the at least two photosensitive layers are different.

Specifically, as shown in FIG. 1, four photosensitive units 100 are illustrated in the image sensor provided by the embodiment of the present disclosure. For each photosensitive unit 100, the photosensitive unit 100 includes two photosensitive layers stacked and not completely overlapped which are respectively a first photosensitive layer 110 and a second photosensitive layer 120.

Figure 2:
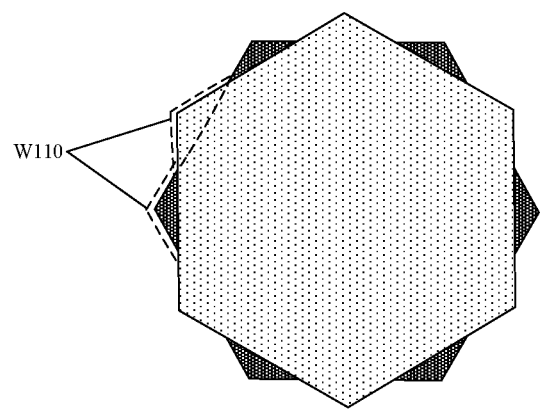
FIG. 2 is an enlarged schematic diagram of a non-overlapping region provided by an exemplary embodiment of the present disclosure.

FIG. 2 is an enlarged schematic diagram of a non-overlapping region provided by an exemplary embodiment of the present disclosure. As shown in FIG. 2, a non-overlapped region W110 refers to a region of a photosensitive layer where the photosensitive layer does not overlap with other photosensitive layers (such as a region enclosed by dotted lines in FIG. 2). Specifically, according to FIG. 1 and FIG. 2, in a photosensitive unit 100, there is a region of the first photosensitive layer 110 with which the second photosensitive layer 120 does not overlap, there is also a region of the second photosensitive layer 120 with which the first photosensitive layer 110 does not overlap, and these two regions constitute regions where the first photosensitive layer 110 and the second photosensitive layer 120 do not overlap with each other. The non-overlapping region W110 is configured to arrange electrode wires, that is, the electrode wires are arranged in regions where each photosensitive layer does not overlap with other photosensitive layers. In each photosensitive unit 100, the electrode wires are arranged in the region where each photosensitive layer does not overlap with other photosensitive layers. Therefore, there is no need to reduce a photosensitive area of the photosensitive layer to arrange the electrode wires, and a utilization rate of the photosensitive area is improved. It should be noted that the electrode wires may be real electrode wires or structure in which a electrode and a photosensitive layer are electrically connected.

It should be noted that, as shown in FIG. 1, the four photosensitive units 100 are schematically illustrated with four dotted boxes, which are only used to explain the existence of the four photosensitive units, and not to limit that there is an actual boundary between two photosensitive units 100.

According to an embodiment of the present disclosure, in a photosensitive unit 100, a photosensitive component content of the first photosensitive layer 110 is different from a photosensitive component content of the second photosensitive layer 120, so that a wavelength range of sensible light corresponding to the first photosensitive layer 110 is different from a wavelength range of sensible light corresponding to the second photosensitive layer 120. Exemplarily, there is part of the wavelength range of sensible light corresponding to the second photosensitive layer 120 which is not covered by the wavelength range of sensible light corresponding to the first photosensitive layer 110. Therefore, on the basis of the wavelength range of sensible light corresponding to the first photosensitive layer 110, the part of the wavelength range of sensible light corresponding to the second photosensitive layer 120 which is not covered by that of the first photosensitive layer 110 may be added to a wavelength range of sensible light of the photosensitive unit, a wavelength range of sensible light of each photosensitive unit 100 is enlarged, and a dynamic range of the image sensor is improved. Accordingly, more image details may be recorded to generate an image with a high dynamic range, which enables people to experience a visual effect close to a real environment.

In order to further improve the dynamic range of the image sensor while improving the utilization rate of the photosensitive area. An embodiment shown in FIG. 3 of the present disclosure is extended on the basis of the embodiment shown in FIG. 1 of the present disclosure. The following focuses on the differences between the embodiment shown in FIG. 3 and the embodiment shown in FIG. 1, and the similarities will not be repeated.

Figure 3:
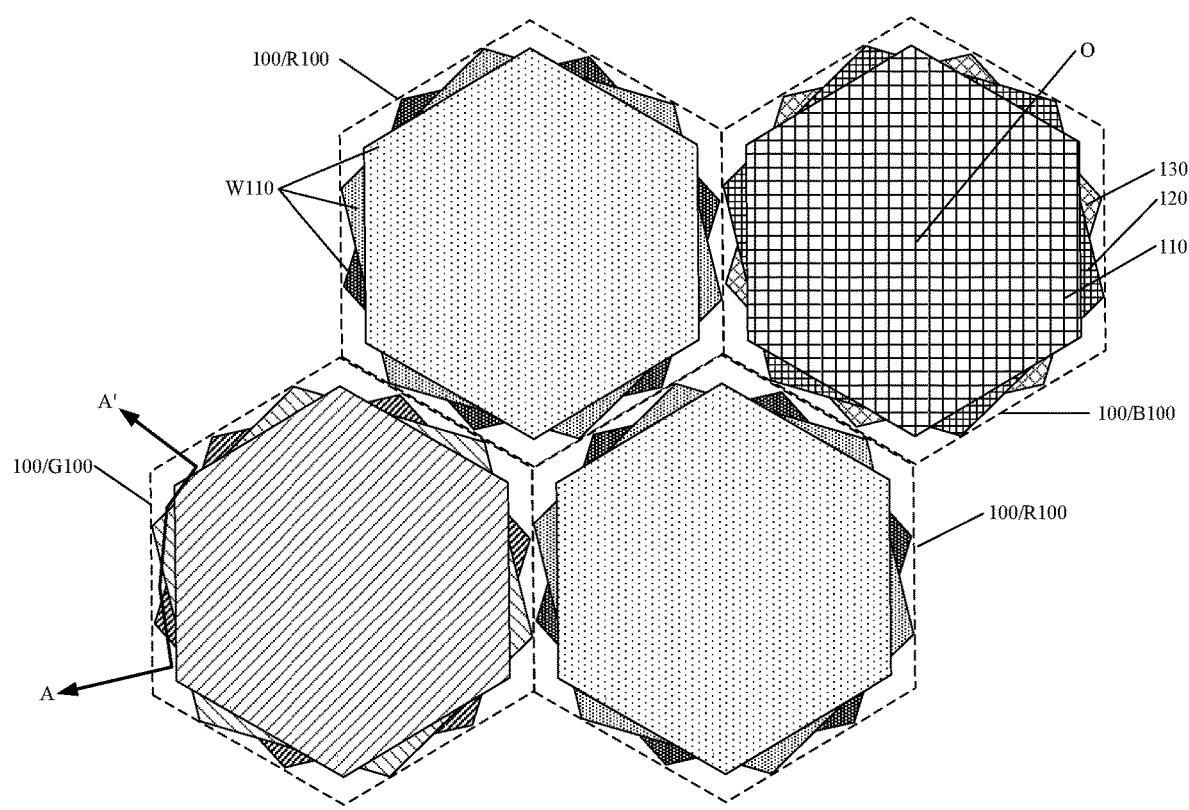
FIG. 3 is a structural schematic diagram of a photosensitive unit provided by another exemplary embodiment of the present disclosure.

FIG. 3 is a structural schematic diagram of a photosensitive unit provided by another exemplary embodiment of the present disclosure. Specifically, as shown in FIG. 3, four photosensitive units 100 are illustrated in an image sensor provided by the embodiment of the present disclosure. For each photosensitive unit 100, the photosensitive unit 100 has three photosensitive layers stacked and not completely overlapped which are respectively a first photosensitive layer 110, a second photosensitive layer 120 and a third photosensitive layer 130. Electrode wires are arranged in regions of the photosensitive unit 100 where the first photosensitive layer 110, the second photosensitive layer 120, and the third photosensitive layer 130 do not overlap with each other, that is, the electrode wires are arranged in regions where each photosensitive layer does not overlap with other photosensitive layers (non-overlapping regions W110). In each photosensitive unit 100, the electrode wires are arranged in the region where each photosensitive layer does not overlap with other photosensitive layers. Therefore, there is no need to reduce a photosensitive area of the photosensitive layer to arrange the electrode wires, and a utilization rate of the photosensitive area is improved.

According to an embodiment of the present disclosure, in a photosensitive unit 100, photosensitive component contents of the first photosensitive layer 110, the second photosensitive layer 120 and the third photosensitive layer 130 are different from each other, so that wavelength ranges of sensible light corresponding to the three photosensitive layers are different from each other. Exemplarily, there is part of the wavelength range of sensible light corresponding to the second photosensitive layer 120 which is not covered by the wavelength range of sensible light corresponding to the first photosensitive layer 110, and there is part of the wavelength range of sensible light corresponding to the third photosensitive layer 130 which is not covered by the wavelength ranges of sensible light corresponding to the first photosensitive layer 110 and the second photosensitive layer 120. Therefore, on the basis of the wavelength range of sensible light corresponding to the first photosensitive layer 110, a wavelength range of sensible light of the photosensitive unit 100 may be enlarged for several times, and a dynamic range of the image sensor may be improved. Accordingly, more image details may be recorded to generate an image with a high dynamic range, which enables people to experience a visual effect close to a real environment.

Specifically, as shown in FIG. 1 to FIG. 3, shapes of the first photosensitive layer 110, the second photosensitive layer 120, and the third photosensitive layer 130 are all orthohexagonal, side lengths of the three photosensitive layers are equal, and the three photosensitive layers may be rotated around a center point O which is a circle center and staggered with each other. Optionally, for a photosensitive unit 100, a shape of the photosensitive layer may at least include one or more of a polygon, an ellipse and a circle. Optionally, for a image sensor, a shape of the photosensitive layer may include one or more of a polygon, an ellipse or a circle.

According to an embodiment of the present disclosure, areas of the at least two photosensitive layers are equal. Specifically, as shown in FIG. 3, as the side lengths of the first photosensitive layer 110, the second photosensitive layer 120 and the third photosensitive layer 130 are equal, areas of the first photosensitive layer 110, the second photosensitive layer 120 and the third photosensitive layer 130 are equal.

In the prior art, taking two adjacent photosensitive layers as an example, in order to arrange electrode wires, an area of a photosensitive layer close to a charge storage part is usually smaller than an area of a photosensitive layer away from the charge storage part. Specifically, in order to provide electrode wires to the photosensitive layer away from the charge storage part, it is necessary to reduce the area of the photosensitive layer close to the charge storage part. The photosensitive layer close to the charge storage part is usually etched to form a non-overlapping region of two adjacent photosensitive layers to arrange the electrode wire. Through this method, area of the photosensitive layer is sacrificed to arrange the electrode wire.

According to an embodiment of the present disclosure, since the electrode wire is arranged in the non-overlapping region W110 which is not formed by reducing the photosensitive layer, there is no need to reduce the photosensitive area of the photosensitive layer to arrange the electrode wires, and the utilization rate of the photosensitive area is improved. Therefore, areas of the first photosensitive layer 110, the second photosensitive layer 120 and the third photosensitive layer 130 are equal. According to the image sensor provided by the embodiment of the present disclosure, photosensitive area of the photosensitive layer may be improved and accordingly a dynamic range of the image sensor is improved.

Figure 4:
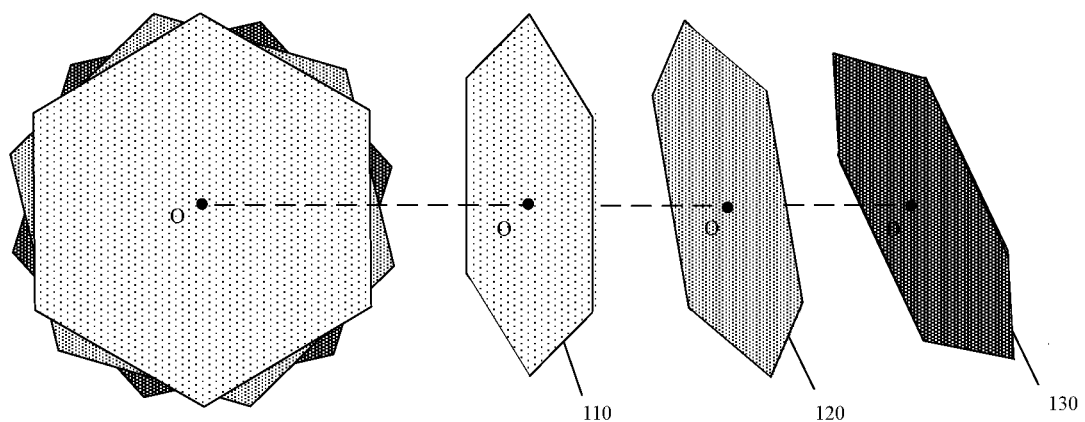
FIG. 4 is an exploded view of photosensitive layers of a photosensitive unit.

FIG. 4 is an exploded view of photosensitive layers of a photosensitive unit. As shown in FIG. 4, the first photosensitive layer 110, the second photosensitive layer 120, and the third photosensitive layer 130 are parallel to each other, and the second photosensitive layer 120 is rotated by a certain degree with respect to the first photosensitive layer 110, and the third photosensitive layer 130 is rotated by another degree with respect to the first photosensitive layer 110, so that the first photosensitive layer 110, the second photosensitive layer 120, and the third photosensitive layer 130 are not completely overlapped with each other.

Figure 5:
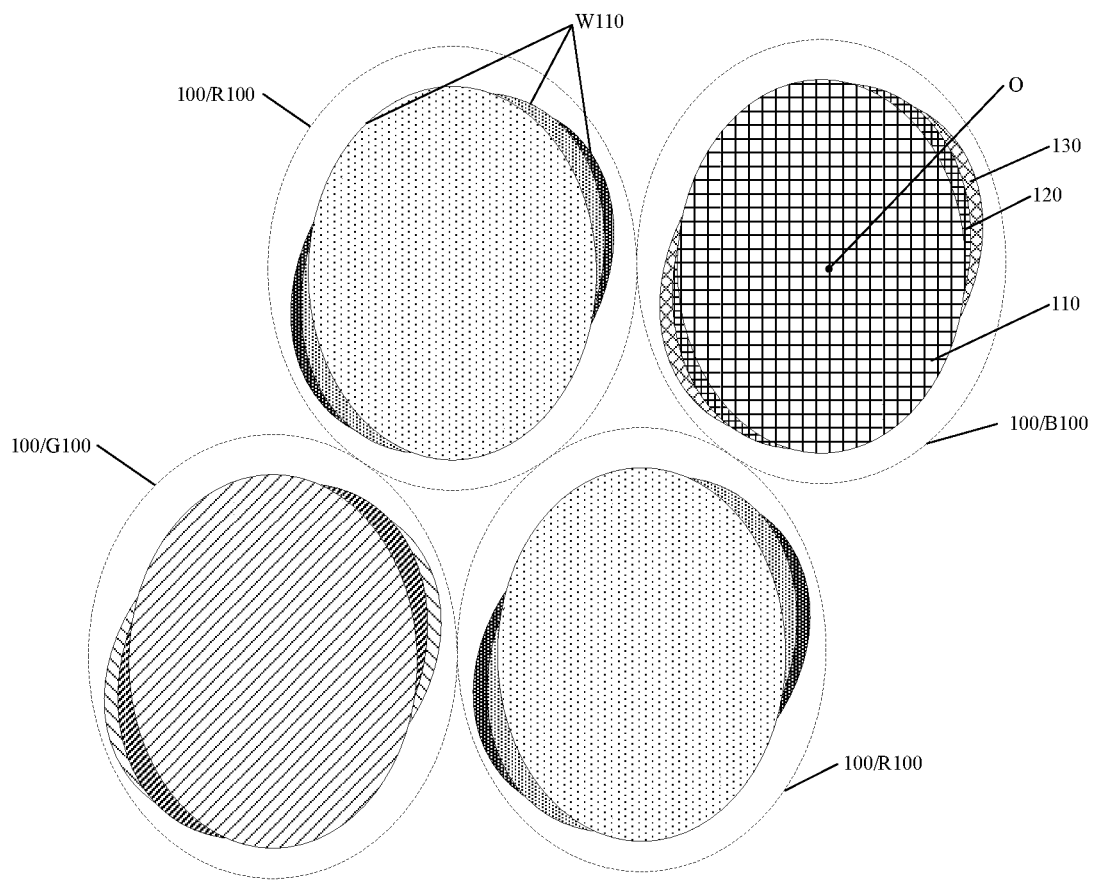
FIG. 5 is a structural schematic diagram of a photosensitive unit provided by still another exemplary embodiment of the present disclosure.

FIG. 5 is a structural schematic diagram of a photosensitive unit provided by still another exemplary embodiment of the present disclosure. The embodiment shown in FIG. 5 of the present disclosure is extended on the basis of the embodiment shown in FIG. 3 of the present disclosure. The following focuses on the differences between the embodiment shown in FIG. 5 and the embodiment shown in FIG. 3, and the similarities will not be repeated. As shown in FIG. 5, shapes of a first photosensitive layer 110, a second photosensitive layer 120, and a third photosensitive layer 130 are all ellipses, major axes of the three photosensitive layers are equal, minor axes of the three photosensitive layers are equal, and the three photosensitive layers may be rotated around a center point O separately and staggered with each other.

According to an embodiment of the present disclosure, a photosensitive component comprises an indium-containing GaN-based compound, and indium component contents of the at least two photosensitive layers are different. Exemplarily, the indium component content refers to the percentage of the amount of substance of the indium element to the sum of the amount of substance of all positively charged elements. Specifically, by adjusting the indium component contents of the first photosensitive layer 110, the second photosensitive layer 120 and the third photosensitive layer 130 to be different, the first photosensitive layer 110, the second photosensitive layer 120 and the third photosensitive layer 130 may respectively sense light with different wavelength ranges, so as to enlarge the dynamic range of the image sensor and generate images with a high dynamic range.

According to an embodiment of the present disclosure, the at least two photosensitive layers are used to sense light of the same color, and a difference between the indium component contents of the at least two photosensitive layers is less than or equal to 4%.

Specifically, as shown in FIG. 1 and FIG. 3, a photosensitive unit 100 in the first row and the first column and a photosensitive unit 100 in the second row and the second column are both red photosensitive units R100 for sensing red light, a photosensitive unit 100 in the first row and the second column is a blue photosensitive unit B100 for sensing blue light, and a photosensitive unit 100 in the second row and the first column is a green photosensitive unit G100 for sensing green light. Optionally, as shown in FIG. 3, the four photosensitive units 100 constitute a pixel group. The reason why a pixel group includes two red photosensitive units R100, a green photosensitive unit G100 and a blue photosensitive unit B100 is because quality of an epitaxial crystal of the red photosensitive unit R100 corresponding to a high-indium component is relatively poor in its preparation process, which results in a lower photosensitive efficiency of the red photosensitive unit R100 than that of the green photosensitive unit G100 and the blue photosensitive unit B100. In addition, different indium component contents lead to different wavelength of sensible light. In a pixel group, photosensitive units 100 capable of sensing three colors of red, green and blue separately are provided, so that an entire visible light spectrum may be covered. When the image sensor senses external light, it can directly record color images with wavelength ranges of all visible light in the environment. In combination with that the at least two photosensitive layers are arranged in each photosensitive unit 100, an image with a high dynamic range may be generated, so that people may experience a visual effect close to the real environment.

Therein, as shown in FIG. 3, a red photosensitive unit R100 will be taken as an example to be described. For the red photosensitive unit R100, the first photosensitive layer 110 is disposed at a position closest to an external light source, the second photosensitive layer 120 is disposed on a side of the first photosensitive layer 110 away from the external light source and the third photosensitive layer 130 is disposed on the side of the second photosensitive layer 120 away from the external light source. The red photosensitive unit R100 includes three photosensitive layers, which are all used to sense red light. And a difference between the indium component contents of the first photosensitive layer 110 and the second photosensitive layer 120 is less than or equal to 4%, and/or a difference between the indium component contents of the second photosensitive layer 120 and the third photosensitive layer 130 is less than or equal to 4%. Exemplarily, an indium component content of the first photosensitive layer 110 is 0.46, an indium component content of the second photosensitive layer 120 is 0.50, and an indium component content of the third photosensitive layer 130 is 0.54. For the green photosensitive unit G100, exemplarily, an indium component content of the first photosensitive layer 110 is 0.21, an indium component content of the second photosensitive layer 120 is 0.25, and an indium component content of the third photosensitive layer 130 is 0.29. For the blue photosensitive unit B100, exemplarily, an indium component content of the first photosensitive layer 110 is 0.01, an indium component content of the second photosensitive layer 120 is 0.05, and an indium component content of the third photosensitive layer 130 is 0.09.

Optionally, a photosensitive unit 100 may include three photosensitive layers, and a difference between the indium component contents of any two of the three photosensitive layers is less than or equal to 4%.

According to the image sensor provided by the embodiment of the present disclosure, since the difference between the indium component contents of the at least two photosensitive layers is less than or equal to 4%, a wavelength range of sensible light of the photosensitive unit 100 is appropriately enlarged when the photosensitive unit 100 is used to sense a single color.

According to an embodiment of the present disclosure, the at least two photosensitive layers include an outer photosensitive layer closest to an external light source. And if the at least two photosensitive layers includes three or more than three photosensitive layers, an indium component content of the outer photosensitive layer is higher than a minimum value of indium component contents of photosensitive layers other than the outer photosensitive layer in the at least two photosensitive layers, and the indium component content of the outer photosensitive layer is lower than a maximum value of the indium component contents of the photosensitive layers other than the outer photosensitive layer in the at least two photosensitive layers.

Specifically, since a photosensitive layer corresponding to a non-maximum and non-minimum indium component content has the largest wavelength range of sensible light, the photosensitive layer corresponding to the non-maximum and non-minimum indium component content is arranged at the position closest to the external light source (namely, the outer photosensitive layer), which may be utilized to improve photosensitive efficiency. As shown in FIG. 3, for the photosensitive unit 100, the indium component content of the first photosensitive layer 110 is higher than the minimum value between the indium component content of the second photosensitive layer 120 and that of the third photosensitive layer 130, and lower than the maximum value between the indium component content of the second photosensitive layer 120 and that of the third photosensitive layer 130, that is, the first photosensitive layer 110 is the outer photosensitive layer, and the indium component content of the first photosensitive layer 110 is an intermediate value among the indium component contents of the three photosensitive layers.

Exemplarily, as shown in FIG. 3, a red photosensitive unit R100 will be taken as an example to be described. The first photosensitive layer 110 is an outer photosensitive layer and the first photosensitive layer 110 is arranged at a position closest to the external light source. For the green photosensitive unit G100, exemplarily, the first photosensitive layer 110 is an outer photosensitive layer, and the first photosensitive layer 110 is arranged at a position closest to the external light source. For the blue photosensitive unit B100, exemplarily, the first photosensitive layer 110 is an outer photosensitive layer, and the first photosensitive layer 110 is arranged at a position closest to the external light source.

According to an embodiment of the present disclosure, in terms of processing technology, a photosensitive layer with a higher indium component content may be manufactured firstly, and then a photosensitive layer with a lower indium component content. The photosensitive layer with a highest indium component content is arranged at a position farthest from the external light source, and the photosensitive layer with a lowest indium component content is arranged at the position closest to the external light source. In short, according to a descending order of the indium component content, the corresponding photosensitive layers are respectively arranged at positions in order from far to near with respect to the external light source.

According to an embodiment of the present disclosure, firstly, in terms of photosensitive efficiency, the photosensitive layer corresponding to the non-maximum and non-minimum indium component content is arranged at the position closest to the external light source (namely, the outer photosensitive layer), which may be utilized to improve photosensitive efficiency. Secondly, in terms of processing technology, the photosensitive layer corresponding to the highest indium component content is arranged at the position farthest from the external light source. Therefore, the photosensitive layer corresponding to the lowest indium component content is arranged at the position of the intermediate layer among the three photosensitive layers.

According to an embodiment of the present disclosure, firstly, in terms of photosensitive efficiency, the photosensitive layer corresponding to the non-maximum and non-minimum indium component content is arranged at the position closest to the external light source (namely, the outer photosensitive layer), which may be utilized to improve photosensitive efficiency. Secondly, in terms of light penetration ability, the photosensitive layer corresponding to the lowest indium component content is arranged at the position farthest from the external light source. Therefore, the photosensitive layer corresponding to the highest indium component content is arranged at the position of the intermediate layer among the three photosensitive layers.

Figure 6:
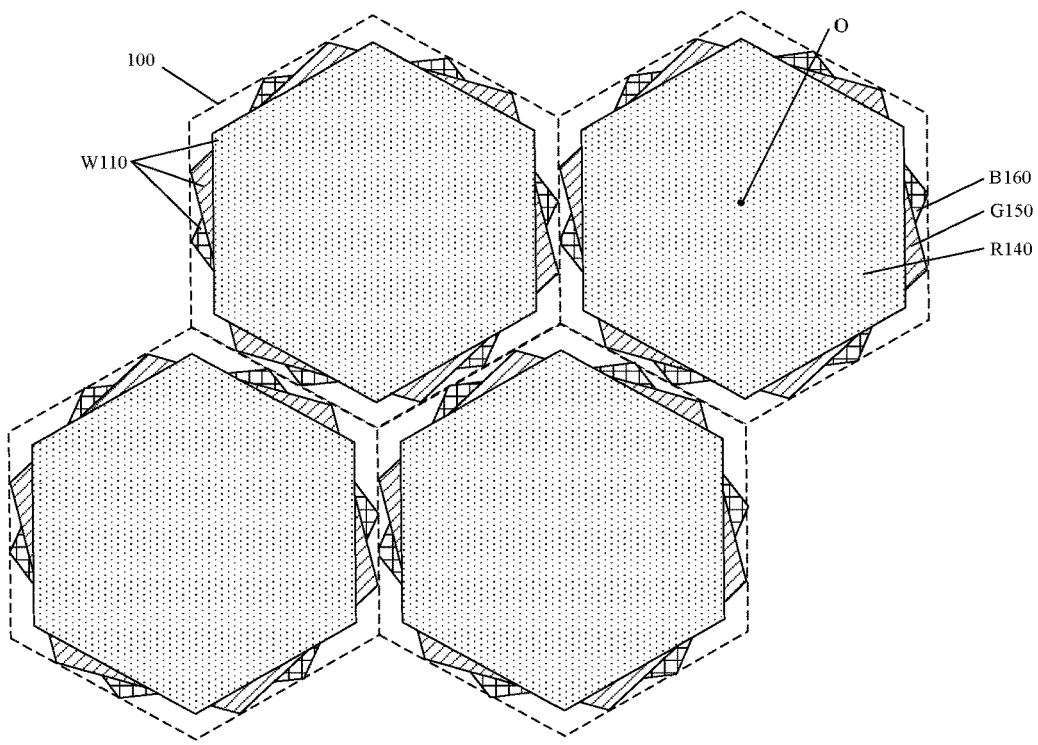
FIG. 6 is a structural schematic diagram of a photosensitive unit provided by yet still another exemplary embodiment of the present disclosure.

FIG. 6 is a structural schematic diagram of a photosensitive unit provided by yet still another exemplary embodiment of the present disclosure. As shown in FIG. 6, the at least two photosensitive layers sense light of different colors, the photosensitive unit 100 includes three photosensitive layers stacked and not completely overlapped, the three photosensitive layers include a red photosensitive layer R140 for sensing red light, a green photosensitive layer G150 for sensing green light and a blue photosensitive layer B160 for sensing blue light, and an indium component content of the red photosensitive layer R140, an indium component content of the green photosensitive layer G150 and an indium component content of the blue photosensitive layer B160 are in a descending order.

Specifically, as shown in FIG. 6, the photosensitive unit 100 has three photosensitive layers stacked and not completely overlapped which are respectively the red photosensitive layer R140, the green photosensitive layer G150, and the blue photosensitive layer B160. Therein electrode wires are arranged in regions of the photosensitive unit 100 where the red photosensitive layer R140, the green photosensitive layer G150, and the blue photosensitive layer B160 do not overlap with each other, that is, the electrode wires are arranged in regions where each photosensitive layer does not overlap with other photosensitive layers (non-overlapped regions W110). In addition, the three photosensitive layers are all orthohexagonal, side lengths of the three photosensitive layers are equal, and the three photosensitive layers may be rotated around a center point O which is a circle center and staggered with each other.

According to an embodiment of the present disclosure, an indium component content of the red photosensitive layer R140, an indium component content of the green photosensitive layer G150 and an indium component content of the blue photosensitive layer B160 are in a descending order. Exemplarily, an indium component content of the red photosensitive layer R140 is 0.50, an indium component content of the green photosensitive layer G150 is 0.25, and an indium component content of the blue photosensitive layer B160 is 0.05. Each photosensitive unit 100 includes the red photosensitive layer R140, the green photosensitive layer G150 and the blue photosensitive layer B160 at the same time, that is, each photosensitive unit 100 is capable of sensing three colors of red, green and blue, so that an entire visible light spectrum may be covered, and integration and pixel density may be improved. When the image sensor senses external light, it can directly record color images with wavelength ranges of all visible light in the environment.

According to an embodiment of the present disclosure, the green photosensitive layer G150 is arranged on the side of the red photosensitive layer R140 away from the external light source, and/or the blue photosensitive layer B160 is arranged on the side of the red photosensitive layer R14 away from the external light source.

Specifically, since the quality of an epitaxial crystal of the red photosensitive unit R140 corresponding to a high-indium component is relatively poor in its preparation process, which results in a lower photosensitive efficiency of the red photosensitive unit R140 than that of the green photosensitive unit G150 and the blue photosensitive unit B160. Therefore, the red photosensitive layer R140 is arranged on the side of the green photosensitive layer G150 close to the external light source, and/or the red photosensitive layer R140 is arranged on the side of the blue photosensitive layer B160 close to the external light source to improve the photosensitive efficiency of the red photosensitive layer R140.

Optionally, as shown in FIG. 6, the green photosensitive layer G150 is arranged between the red photosensitive layer R140 and the blue photosensitive layer B160. Because the blue photosensitive layer B160 has the best quality of an epitaxial crystal and the highest photosensitive efficiency, the blue photosensitive layer B160 may be arranged at the position farthest from the external light source.

According to an embodiment of the present disclosure, the at least two photosensitive layers are rotated around a center of the photosensitive unit separately and staggered with each other, so that the at least two photosensitive layers are not completely overlapped.

As shown in FIG. 1 to FIG. 6, the at least two photosensitive layers included in each photosensitive unit 100 are rotated around a center point O of the photosensitive unit and staggered with each other to obtain the at least two photosensitive layers not completely overlapped as shown in FIG. 1 to FIG. 6. The way of rotational staggering according to the embodiment of the present disclosure occupies the smallest area of the photosensitive unit 100, among image sensors with the same area, more photosensitive units 100 may be accommodated without sacrificing the photosensitive area. And integration of the photosensitive unit 100 is higher, such that the dynamic range of the image sensor is improved. In addition, the embodiment of the present disclosure is not further limited to the degree of rotation staggering, so long as the at least two photosensitive layers are not completely overlapped.

Figure 7:
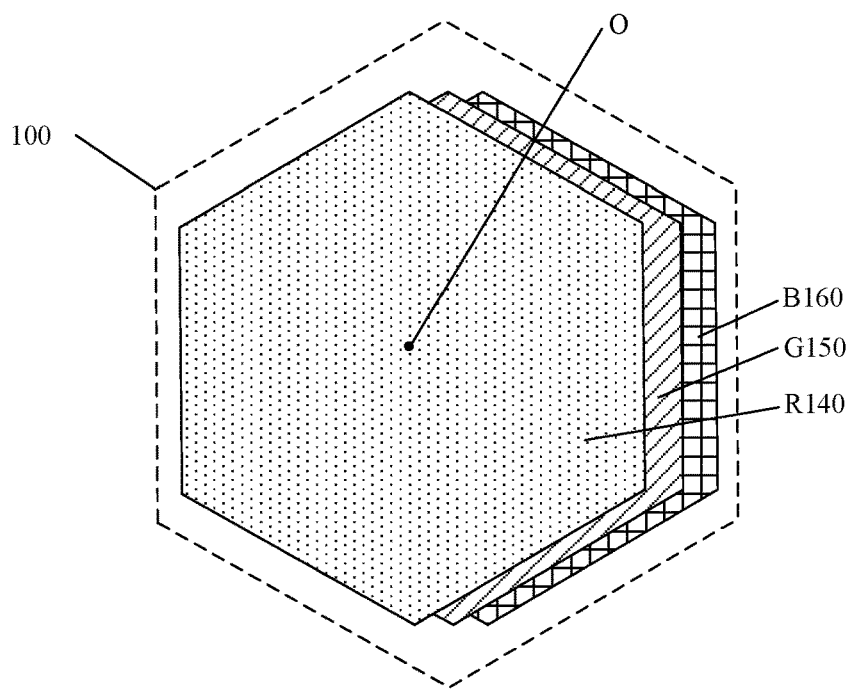
FIG. 7 is a structural schematic diagram of a photosensitive unit provided by yet still another exemplary embodiment of the present disclosure.

FIG. 7 is a structural schematic diagram of a photosensitive unit provided by yet still another exemplary embodiment of the present disclosure. As shown in FIG. 7, optionally, the three photosensitive layers included in each photosensitive unit 100 are staggered by translating to obtain a photosensitive unit 100 with three photosensitive layers not completely overlapped as shown in FIG. 7. The embodiment of the present disclosure is not limited to a translating distance between the photosensitive layers staggered, so long as the at least two photosensitive layers are not completely overlapped.

Figure 8:
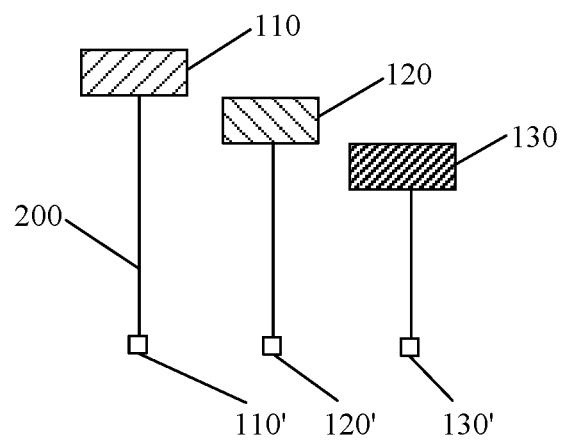
FIG. 8 is a cross-sectional view taken along AA' of FIG. 3.

FIG. 8 is a cross-sectional view taken along AA' of FIG. 3. As shown in FIG. 8, an image sensor provided by an embodiment of the present disclosure further includes charge storage parts electrically connected to each of the photosensitive layers separately, where the charge storage parts are electrically connected to electrode wires 200 separately, and the charge storage parts are electrically insulated from each other.

As shown in FIG. 8, only a cross-sectional view of the green photosensitive unit G100 in the second row and the first column in FIG. 3 taken along AA' will be described as an example. The image sensor provided by the embodiment of the present disclosure further includes: a first charge storage part 110' electrically connected to the first photosensitive layer 110, a second charge storage part 120' electrically connected to the second photosensitive layer 120, and a third charge storage part 130' electrically connected to the third photosensitive layer 130. The first charge storage part 110' is configured to store charges generated by light sensed by the first photosensitive layer 110. The first photosensitive layer 110 is electrically connected to the first charge storage part 110' through an electrode wire 200 to transfer charges to the first charge storage part 110'. The second charge storage part 120' is configured to store charges generated by light sensed by the second photosensitive layer 120. The second photosensitive layer 120 is electrically connected to the second charge storage part 120' through an electrode wire 200 to transfer charges to the second charge storage part 120'. The third charge storage part 130' is configured to store charges generated by light sensed by the third photosensitive layer 130. The third photosensitive layer 130 is electrically connected to the third charge storage part 130' through an electrode wire 200 to transfer charges to the third charge storage part 130'.

Specifically, the first charge storage part 110', the second charge storage part 120', and the third charge storage part 130' are electrically insulated from each other, that is, each photosensitive layer is electrically connected to a single charge storage part correspondingly. The charges stored in the charge storage part are used to be read and converted into light signals to generate a high dynamic range image, so that people may experience a visual effect close to a real environment. It should be noted that the electrode wires 200 in FIG. 8 is only shown in a straight line and does not represent the actual route of the electrode wires 200.

Figure 9:
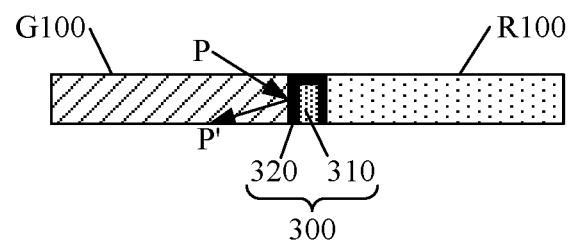
FIG. 9 is a partial enlarged structural schematic diagram of an isolation part provided by an exemplary embodiment of the present disclosure.

The image sensor provided by the embodiment of the present disclosure further includes a plurality of photosensitive units 100, and an isolation part 300 disposed between two adjacent photosensitive units 100, the isolation part 300 being configured to electrically insulate the adjacent photosensitive units 100 from each other. Optionally the isolation part 300 is made of insulating material. Optionally, FIG. 9 is a partial enlarged structural schematic diagram of an isolation part provided by an exemplary embodiment of the present disclosure. As shown in FIG. 9, the isolation part 300 includes a metal member 310 and an insulating layer 320 disposed on an outer surface of the metal member 310, the insulating layer 320 may be a transparent insulating material for electrically insulating adjacent photosensitive units 100 from each other.

According to an embodiment of the present disclosure, the metal member 310 includes a metal grid, which can reflect light which obliquely projects to the photosensitive unit 100 to the photosensitive unit 100 (incident light rays P and reflected light rays P' as shown in FIG. 9) and isolate light between adjacent photosensitive units 100 to prevent crosstalk. It should be noted that the insulating layer 320 is used to electrically insulate the metal grid and the photosensitive unit 100 from each other. In addition, the photosensitive unit 100 includes a single-quantum-well structure or a multiple-quantum-well structure arranged in layers.

It should be noted that the isolation part is not shown in FIG. 1 to FIG. 8 of the present disclosure.

The image sensor provided by the embodiment of the present disclosure further includes a first semiconductor layer and a second semiconductor layer, the first semiconductor layer, the photosensitive layer and the second semiconductor being stacked in sequence.

It should be noted that the first semiconductor layer and the second semiconductor layer are used to form a potential difference, the charges generated by the first photosensitive layer 110 are transferred to the first charge storage part 110', the charges generated by the second photosensitive layer 120 are transferred to the second charge storage part 120', and the charges generated by the third photosensitive layer 130 are transferred to the third charge storage part 130'. Optionally, the first semiconductor layer includes a P-type semiconductor and the second semiconductor layer includes an N-type semiconductor. Optionally, the first semiconductor layer includes an N-type semiconductor and the second semiconductor layer includes a P-type semiconductor. Embodiments of the present disclosure are not further limited to the first semiconductor layer and the second semiconductor layer, as long as the charge generated by the photosensitive unit 100 can be transferred to the charge storage part.

It should be noted that, as shown in FIG. 8, the first semiconductor layer or the second semiconductor layer between the first photosensitive layer 110 and the second photosensitive layer 120 or between the second photosensitive layer 120 and the third photosensitive layer 130 is not shown in FIG. 8.

According to an embodiment of the present disclosure, a photosensitive material of the photosensitive unit 100 includes indium gallium nitride (InGaN).

The basic principles of the present disclosure have been described above in conjunction with specific embodiments. However, it should be pointed out that the benefits, advantages, effects, etc. mentioned in the present disclosure are only examples rather than limitations, and these benefits, advantages, effects, etc., are not considered to be required for each embodiment of this disclosure. In addition, the specific details disclosed above are only for the purpose of example and easy understanding, rather than limiting, and the above-mentioned details do not limit the present disclosure to be implemented by using the above-mentioned specific details.

Words such as "including", "comprising", "having" and the like are open-ended words meaning "including but not limited to" and are used interchangeably therewith. As used herein, the words "or" and "and" refer to and are used interchangeably with the word "and/or" unless the context clearly dictates otherwise. As used herein, the word "such as" refers to and is used interchangeably with the phrase "such as but not limited to".

What is claimed is:

1. An image sensor, comprising:
   at least one photosensitive unit, the photosensitive unit comprising at least two photosensitive layers stacked and not completely overlapped, wherein a region where each of the at least two photosensitive layers is not overlapped with other photosensitive layers is configured to arrange an electrode wire, and photosensitive component contents of the at least two photosensitive layers are different.

2. The image sensor according to claim 1, wherein areas of the at least two photosensitive layers are equal.

3. The image sensor according to claim 1, wherein a photosensitive component comprises an indium-containing GaN-based compound, and indium component contents of the at least two photosensitive layers are different.

4. The image sensor according to claim 3, wherein the at least two photosensitive layers sense light of the same color, and a difference between the indium component contents of the at least two photosensitive layers is less than or equal to 4%.

5. The image sensor according to claim 4, wherein the at least two photosensitive layers comprise an outer photosensitive layer closest to an external light source; and if the at least two photosensitive layers comprise three or more than three photosensitive layers, an indium component content of the outer photosensitive layer is higher than a minimum value of indium component contents of photosensitive layers other than the outer photosensitive layer in the at least two photosensitive layers, and the indium component content of the outer photosensitive layer is lower than a maximum value of the indium component contents of the photosensitive layers other than the outer photosensitive layer in the at least two photosensitive layers.

6. The image sensor according to claim 3, wherein the at least two photosensitive layers sense light of different colors, the photosensitive unit comprises three photosensitive layers stacked and not completely overlapped, the three photosensitive layers comprise a red photosensitive layer for sensing red light, a green photosensitive layer for sensing green light and a blue photosensitive layer for sensing blue light, and an indium component content of the red photosensitive layer, an indium component content of the green photosensitive layer and an indium component content of the blue photosensitive layer are in a descending order.

7. The image sensor according to claim 6, wherein the green photosensitive layer is stacked on a side of the red photosensitive layer away from an external light source, and/or
   the blue photosensitive layer is stacked on the side of the red photosensitive layer away from the external light source.

8. The image sensor according to claim 1, wherein the at least two photosensitive layers are rotationally staggered with each other with a center of the photosensitive unit as a rotation center to form the at least two photosensitive layers stacked and not completely overlapped.

9. The image sensor according to claim 1, further comprising:
   charge storage parts electrically connected to the at least two photosensitive layer respectively, wherein the charge storage part is electrically connected to the electrode wire, and charge storage parts are electrically insulated from each other.

10. The image sensor according to claim 1, further comprising:
    a plurality of the photosensitive units, and an isolation part provided between two adjacent photosensitive units, wherein the isolation part is configured to electrically insulate the adjacent photosensitive units from each other.

11. The image sensor according to claim 10, wherein the isolation part comprises a metal member and a transparent insulation layer arranged on an outer surface of the metal member; and the metal member comprises a metal grid used for reflecting light obliquely projecting to the photosensitive unit.

12. The image sensor according to claim 1, wherein a shape of the at least two photosensitive layers comprises one or more of a polygon, an ellipse and a circle.

13. The image sensor according to claim 1, further comprising a first semiconductor layer and a second semiconductor layer, the first semiconductor layer, the photosensitive layer and the second semiconductor being stacked in sequence.

* * * * *